United States Patent
Fonash et al.

[11] Patent Number: 6,013,565
[45] Date of Patent: Jan. 11, 2000

[54] HIGH CONDUCTIVITY THIN FILM MATERIAL FOR SEMICONDUCTOR DEVICE

[75] Inventors: Stephen J. Fonash, State College, Pa.; Ramesh Kakkad, Kanagawa, Japan

[73] Assignee: Penn State Research Foundation, University Park, Pa.

[21] Appl. No.: 08/290,227

[22] Filed: Aug. 15, 1994

Related U.S. Application Data

[63] Continuation of application No. 07/808,309, Dec. 16, 1991, abandoned.

[51] Int. Cl.$^7$ .................................................. H07L 21/02
[52] U.S. Cl. ........................................ 438/478; 438/482
[58] Field of Search ...................... 438/478–482

[56] References Cited

U.S. PATENT DOCUMENTS

| | | | |
|---|---|---|---|
| 4,749,588 | 6/1988 | Fukuda et al. | 427/39 |
| 4,790,883 | 12/1988 | Sichanugrist et al. | 427/39 |
| 4,841,349 | 6/1989 | Nakano | 307/311 |
| 4,892,592 | 1/1990 | Dickson et al. | 437/4 |
| 4,897,360 | 1/1990 | Guckel et al. | 437/7 |
| 4,904,611 | 2/1990 | Chiang et al. | 437/24 |
| 5,100,817 | 3/1992 | Cedarbaum | 437/56 |
| 5,112,765 | 5/1992 | Cederbaum | 437/41 |

Primary Examiner—David B. Hardy
Attorney, Agent, or Firm—Flehr Hohbach Test Albritton & Herbert LLP

[57] ABSTRACT

An ultra-thin highly electrically conductive material is prepared by depositing an amorphous material, substantially free of crystal growth-inducing nuclei and sites, onto a substrate. Deposition is preferably with a plasma deposition reactor, with semiconductor dopants introduced during deposition. Deposition time is preferably adjusted to create an amorphous film of a desired thickness, e.g., 200 Å. After deposition, the amorphous film is annealed preferably with a rapid thermal annealing process for four minutes at 700° C. The annealing triggers the creation of nuclei and subsequent large grain growth in the film, releases energy contained within the amorphous material, and helps drive crystallization and dopant activation. After annealing the material is completely crystallized, and contains large grains whose lateral dimensions can exceed the film thickness by a factor of fifty. Because the grain structure is large there are few grain boundaries to absorb dopants and carriers, and thus degrade electrical conductivity. Thin film material produced according to the present invention can exhibit conductivity $10^{10}$ times better than prior art materials at 200 Å thickness. Such material is highly suitable in thin film semiconductor structures including buried gate memory devices, shallow emitter devices, as well as photovoltaic cells, X-ray and other radiation detectors. The disclosed annealing process will substantially improve conductivity of amorphous thin film materials, even if such materials are produced by methods other than deposition.

19 Claims, 5 Drawing Sheets

HIGH CONDUCTIVITY THIN FILM MATERIAL FOR SEMICONDUCTOR DEVICE

This is a continuation of application Ser. No. 07/808,309 filed Dec. 16, 1991, now abandoned.

FIELD OF THE INVENTION

The present invention relates generally to the production of semiconductor thin film materials, and more particularly to ultra-thin film highly conductive materials used as a contact layer in photovoltaic cells, p-i-n detectors, radiation sensors and the like.

BACKGROUND OF THE INVENTION

Thin film, p-type and n-type highly conductive materials are used as contact layers in many semiconductor structures, including photovoltaic cells, particle detectors, X-ray and electromagnetic radiation detectors that convert incoming radiation to electrical output signals.

As shown in FIG. 1, such devices 2 typically include a layer of semiconductor detecting material 4 that detects the incoming particle or electromagnetic radiation 6, and emits an electrical signal 8 in response to such detection. A front (or radiation entry) surface of the detecting material is at least partially covered by a layer of thin film, preferably high conductivity material 10 to which a first electrical lead 12 is coupled. Commonly, device 2 includes a thin layer of protective transparent substrate material such as glass 14 that overlies this contact layer 10. A back surface of material 4 is at least partially covered by a layer of high conductivity material 16 to which a second electrical lead 18 is coupled. In some devices, the lower surface of back contact layer 16 is made reflective 20 to cause incoming radiation to pass through the detection layer twice, effectively increasing the device signal output. In such applications, back contact layer 16 must be thin so as not to attenuate incoming radiation enroute to the reflective region 20. Electrical contact between the device 2 and the outside world is via contact layers 10 and 16 using leads 12 and 18. The present invention is directed toward the production of an improved thin film material suitable for front contact layer 10 and, where a thin layer is required, for back contact layer 16.

Incoming radiation 6 (e.g., light, IR, X-ray, etc.) must pass at least partially through front contact layer 10 (as well as the transparent layer 14) before entering the detection layer. Therefore, to reduce attenuation, the front contact layer's thickness 22 should be minimal, preferably 200 Å or less for photovoltaic cells, and 800 Å or less for electromagnetic radiation detectors. Further, because electrical signals from the device 2 must pass through the upper contact layer before reaching lead 12, layer 10 should be highly conductive electrically, to minimize signal loss. Because electrical signals also pass through lower contact surface 16 before reaching lead 18;, layer 16 should also be highly conductive electrically to minimize electrical losses. However layer 16 need not be thin unless a reflective surface 20 is utilized by the device 2.

It has been surprisingly difficult in the prior art to produce highly conductive deposited thin film material for use in semiconductors. In the prior art, contact layer materials are either a heavily doped amorphous material, or a heavily doped microcrystalline semiconductor material. Semiconductor devices including such materials are not optimally designed because the radiated losses and contact layer resistance is excessive. As a result, such devices tend to be inefficient and require a relatively large amount of incoming radiation to produce a useful electrical output signal.

The prior art's use of amorphous material for contact layers, for example as the p-layer and/or n-layer in a p-i-n structure, has drawbacks because by nature amorphous materials store energy that can dissipate over time. During dissipation, the energy promotes chemical reactions that create instability and degradation in any semiconductor material using the material.

In addition, it is well known that light can cause degradation in amorphous silicon materials, and thus amorphous photovoltaic devices experience conversion efficiency degradation relatively rapidly. Further, semiconductor dopants tend not to modulate conductivity as efficiently in amorphous materials as in crystalline structures, which results in more resistive contact layers.

The other prior art approach to manufacturing a thin film contact layer avoids amorphous materials, and instead uses a fine-grained microcrystalline material, such as the material depicted for layer 10 in FIG. 1. Using this approach, the crystals are created during a deposition growth (e.g., plasma enhanced chemical vapor deposition). Post-deposition, the crystals may be subjected to an annealing process to increase the grain size and improve electrical conductivity. Often, however, annealing cannot be accomplished because the temperatures required to increase grain size (and thus improve electrical conductivity) exceed about 950° C. Frequently such high temperatures cannot be tolerated by the other materials in the device, e.g., the substrate, the detector layer. For example, prior art detectors on inexpensive glass substrates do not employ such annealed contact layers because of the excessive heat that would be required.

Large grain size, where it can be achieved in contact layers, would promote improved conductivity by minimizing the number of grain boundaries, which tend to "soak up" semiconductor dopants and carriers, rendering them less effective and making the contact layer material less conductive. Generally a large grain size is associated with a large volume fraction of the crystalline material.

Unfortunately prior art deposition-created crystals are essentially isotropic microcrystals, growing during deposition no larger laterally than the film thickness. Thus as depicted schematically in FIG. 1, contact layer 10 comprises a layer of many small sized microcrystals 24, whose lateral dimensions are no larger than the contact layer's thickness 22. Further, because the crystals 24 have such small grain size, there are many grain boundaries 26 that absorb dopant as well as carriers, hindering electrical conductivity. Although larger microcrystals 24 could be grown by increasing the film thickness 22, thereby improving electrical conductivity by decreasing the number of grain boundaries 26, the increased thickness would degrade optical transmission due to increased absorption losses. Although for ease of illustration, the crystals 24 are depicted as identical cubes in FIG. 1, in reality the essentially isotropic crystals need not necessarily be identical in size and shape to one another.

Generally, such deposition produced microcrystalline silicon contact layers (doped p-type or doped n-type) have conductivities in the range of $10^{-3}$ to 10 S/cm, but only for thicknesses exceeding 800 Å. As film thickness is decreased below about 400 Å, conductivity falls by many orders of magnitude. This conductivity loss coincides with a decrease in Raman signal strength at 520 $cm^{-1}$, which corresponds to the volume fraction of Si in the crystalline phase, and coincides with an increase in the Raman signal at 480 $cm^{-1}$, which corresponds to volume fraction of Si in the amorphous phase.

In summary, there is a need for an ultra-thin contact material that is highly conductive electrically. Preferably such material should be stable, easily doped and highly responsive to doping, and capable of production using a low temperature semiconductor process. The present invention discloses such a material, and a low temperature method for producing the material.

SUMMARY OF THE INVENTION

The present invention discloses a process for minimizing grain boundaries in an ultra-thin polycrystalline material, thereby lessening absorption of dopants and carriers into such boundaries and thus substantially improving the material's electrical conductivity. The resultant ultra-thin highly conductive material is especially suitable for use as a semiconductor contact layer.

In the prior art, isotropic crystals are grown during deposition and, in situations where high processing temperatures can be used, may then be annealed to enlarge crystal size. By contrast, the present invention employs a relatively low temperature, short time annealing process to transform a substantially crystal-free deposited amorphous film to induce non-isotropic large size crystal grains therein.

The amorphous film is preferably deposited onto a substrate using a plasma deposition reactor, producing a deposited precursor material essentially free of preexisting nucleation sites as the source material. Dopants may be introduced in a conventional manner during deposition, which continues until a film of a desired thickness is produced, e.g., about 200 Å.

After deposition, the deposited amorphous film is subjected to a preferably low temperature annealing process that triggers the creation of nuclei and subsequent large grain growth. The annealing process also releases energy contained within the amorphous film, rendering the annealed material more stable.

Annealing causes the amorphous film to become completely crystallized, and large grain size is promoted because the precursor material was substantially nuclei-free. The resultant grains or crystals are non-isotropic, with lateral dimensions that can be fifty times greater than the film thickness. Because this large crystal structure represents fewer grain boundaries to absorb and decrease the efficiency of dopants, dopants modulate conductivity very efficiently. Applicants' annealed material exhibits conductivity $10^{10}$ better than prior art contact layer materials at layer thicknesses of about 200 Å. Photovoltaic cells, detectors and the like incorporating a contact layer according to the present invention will function more efficiently than such devices incorporating prior art poor conductivity contact layers.

Other features and advantages of the invention will appear from the following description in which the preferred embodiments have been set forth in detail in conjunction with the accompanying drawings.

DETAILED DESCRIPTION OF THE PREFERRED EMBODIMENTS

Figure 1:
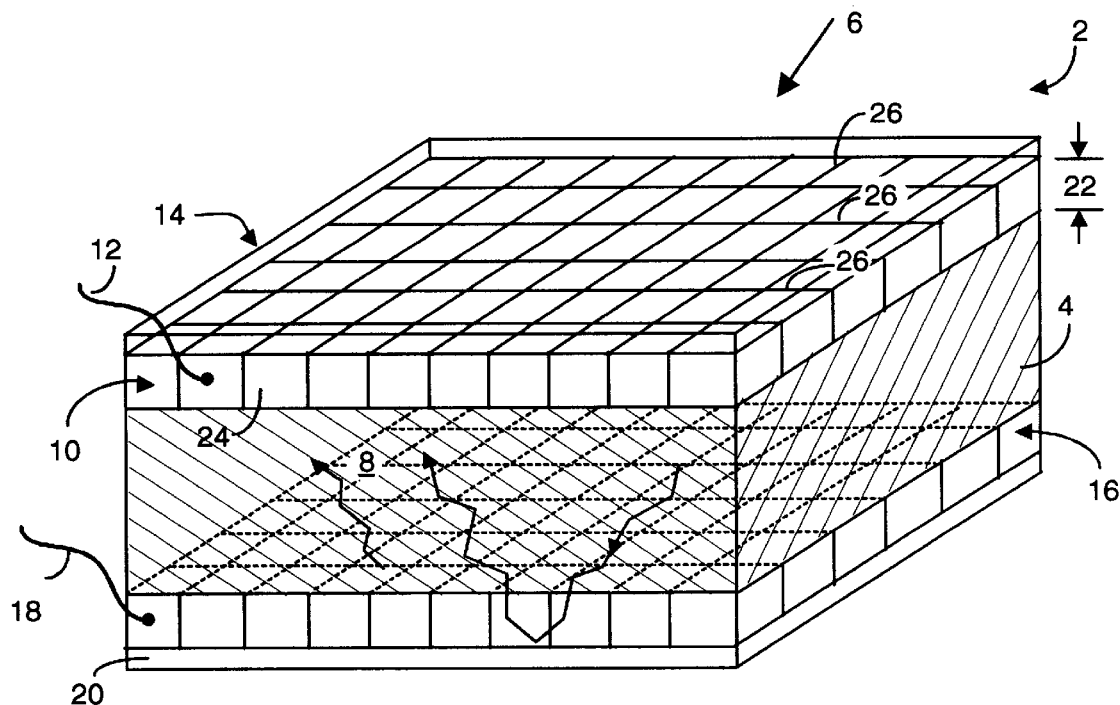
FIG. 1 depicts a prior art detector device whose contact layer comprises essentially isotropic crystals.
Figure 2:
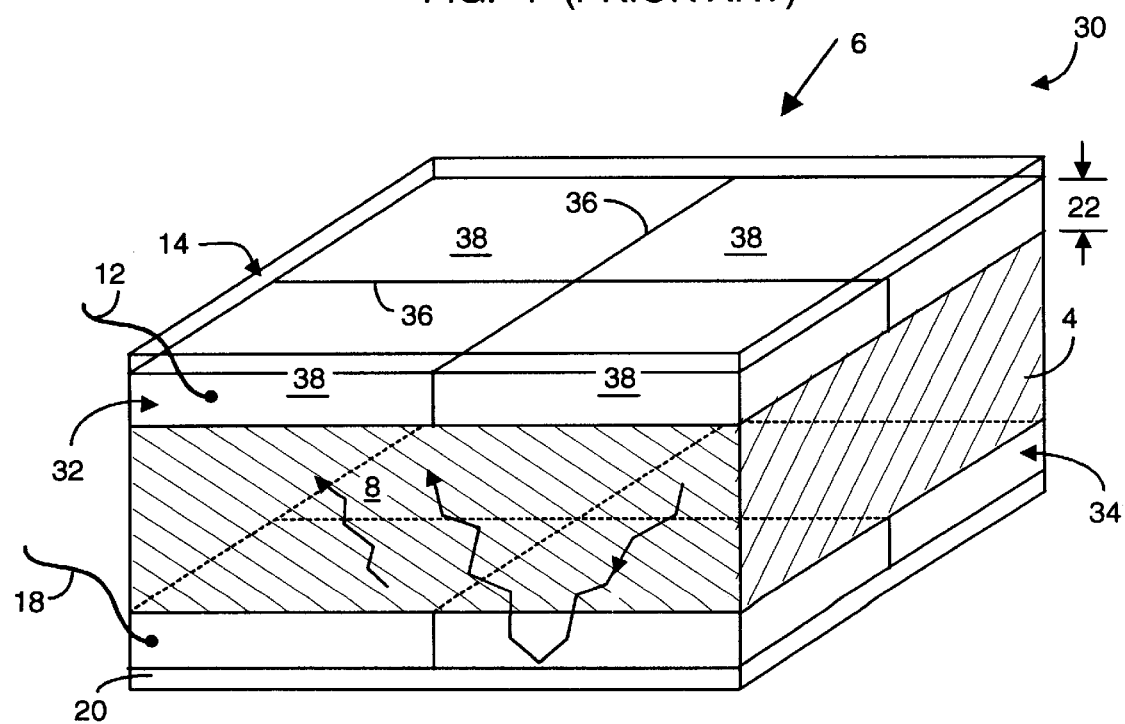
FIG. 2 depicts a detector device including a contact layer fabricated according to the present invention.

FIG. 2 depicts a detector device 30 according to the present invention. Device 30 is similar to the prior art device of FIG. 1 except that the front contact layer 32 (and in some embodiments the back contact layer 34 as well) is produced according to the present invention. In FIG. 2, contact layer 32 contains a relatively few crystals 38, which are not isotropic, with lateral dimensions that far exceed the film thickness 22. Because crystals 38 are so large, there are relatively few grain boundaries 36 to soak up dopant and carriers and thus impair electrical conductivity. By contrast, the prior art depicted in FIG. 1 provides a layer 10 comprising many smaller isotropic crystals, whose lateral dimensions do not exceed the film thickness, with many dopant absorbing grain boundaries. Thus, for a given film thickness 22, layer 32 according to the present invention will exhibit an electrical conductivity far superior to layer 10 according to the prior art. It is understood that for ease of illustration, crystals 38 in FIG. 2 are depicted as being identical whereas in reality these crystals may have different sizes and shapes.

Figure 3:
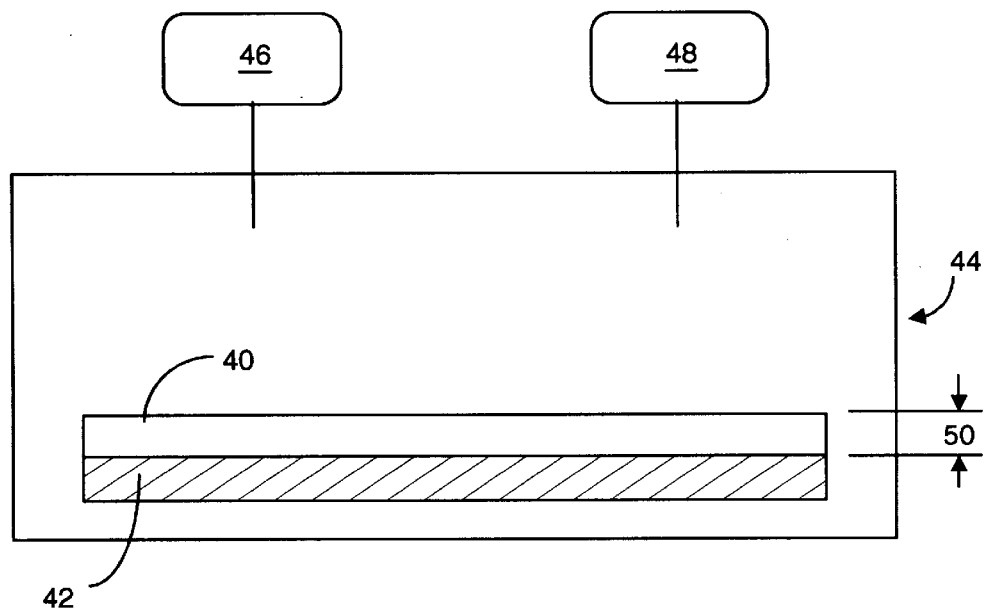
FIGS. 3 and 4 depict the formation of a highly electrically conductive, thin film material, according to the present invention.
Figure 4:
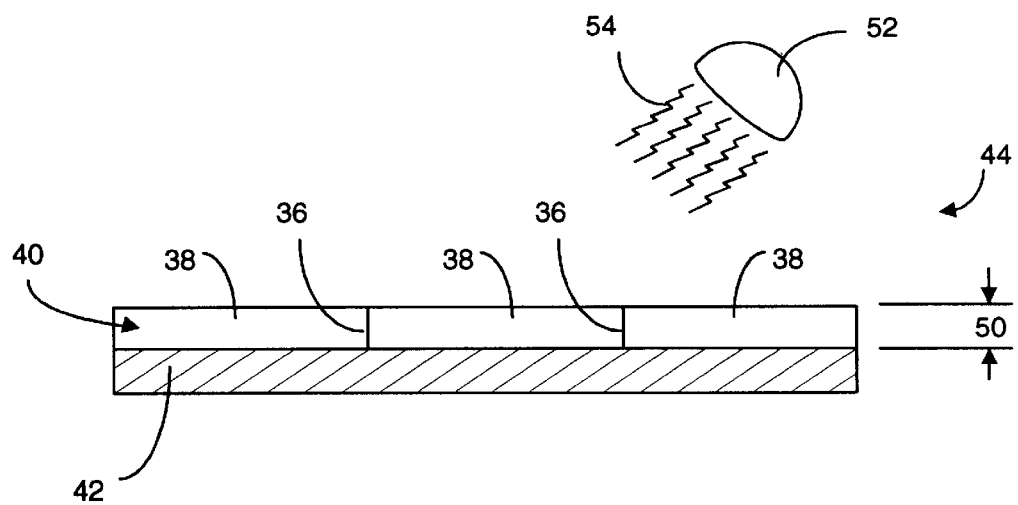

FIGS. 3 and 4 depict the procedure by which material for layer 32 is produced. As shown in FIG. 3, a film 40 is deposited upon a substrate 42 preferably within a plasma deposition reactor 44. Substrate 42 may in fact be the protective, preferably transparent, layer 14 shown in FIG. 2. Film 40 is an amorphous material that contains essentially no nuclei or sites where crystals might form, and is deposited from a source material 46 such as Si-containing gas introduced into a plasma or chemical vapor deposition reactor, or a sputtering target material in a sputtering deposition system. Dopants 48 are preferably introduced into the film 40 during deposition.

With regard to FIG. 3, preferably substrate 42 is a transparent material such as Corning 7059 glass, or quartz when film 40 is to be the front contact layer 32 in a device, although other materials also could be used. Where a reflector back contact layer 34 is required, film 40 may be a metal coated glass or quartz film. As will be described, following deposition, the film 40 will be annealed preferably at low temperature. As a result of the low temperature process, relatively inexpensive material may be used for substrate 42 without concern for heat induced deformation or flow (e.g., Corning 7059 glass).

In the preferred embodiment, reactor 44 is a load-locked, ultra-high vacuum, parallel plate plasma deposition reactor such as described in *Applied Physics Letters* 54 (16) 1537 (1989), S. Wiedeman, et al. Using this reactor, deposition occurs under conditions of 1 Torr, 200 sccm total flow of 50:1 silane gas to dopant gas, 250° C., 500 mW/cm$^2$ DC power density. With respect to dopants, for p-type film 40, a source 48 provides 50:1 hydrogen dilution of diborane in silane, and for n-type film a 50:1 hydrogen dilution of phosphine in silane. In each case, the dopant concentration in silane was preferably between about 1% and 4%, although other source and doping gases, and other concentrations also could be used.

Of course, reactors other than plasma deposition could be used to create film 40, for example low pressure chemical vapor deposition, sputter deposition, thermal deposition, physical vapor deposition, and photochemical vapor deposition. Regardless of the manner of deposition, the thickness 50 of the deposited film 40 is preferably governed by adjusting the deposition time. For applicants' testing, deposition occurred at the rate of a few angstroms per second, although other deposition rates could be used, including considerably faster deposition rates. Film 40 generally has a thickness 50 of less than 400 Å, and more preferably less than about 200 Å.

FIG. 4 depicts the manner by which a thin layer of amorphous film 40 deposited on a substrate 42 is rendered into a highly conductive material. After deposition is complete, the amorphous film 40 is annealed, preferably with a broad beam tungsten-halogen light source 52 to induce crystallization by low temperature rapid thermal annealing. As noted, the preferably low temperature, short anneal time minimizes distortion and/or flow of the substrate 42. Annealing could, however, also be accomplished using a low temperature furnace for a longer time period. The time interval between deposition formation of the amorphous thin film, and the anneal process appears non-critical. For example, applicants have delayed annealing the film 40 as long as several months post-deposition, and as short as several minutes.

More specifically, annealing energy shown in FIG. 4 as 54, from source 52 causes atoms within the amorphous material comprising film 40 to come together to form nuclei, which nuclei then grow to form grains. In addition, energy 54 tends to release the energy stored within the amorphous material comprising film 40, allowing this energy to help drive the crystallization and dopant activation process. Applicants believe this energy release also tends to render the film 40 more stable. Because film 40 was formed from material essentially free of crystal growth-inducing nuclei and sites, it is assured that grains formed from the annealing process will be large. Further, because nucleation occurs in an amorphous material, the crystallized film 40 is not prejudiced by the presence of deposition formed pre-existing grain nuclei or deposition formed isotropic grains.

As a result, as depicted in FIG. 2 and FIG. 4, annealing film 40 causes relatively large crystals 38 to form non-isotropically, with relatively few grain boundaries to absorb dopants and thus degrade electrical conductivity. Measurements indicate that after annealing, film 40 has crystals 38 whose lateral dimensions are on the order of 1 $\mu$m, e.g., fifty times the 200 Å thickness of the film. This is in contrast to FIG. 1, wherein a prior art 200 Å film contains isotropic crystals 18 whose lateral dimensions are limited to the film thickness, e.g., to 200 Å or 0.02 $\mu$m, resulting in many grain boundaries 20. The electron diffraction patterns of both n-type and p-type crystallized films have been inspected to confirm 100% crystallization. It is the large grain size, resulting in fewer grain boundaries, and the complete crystallization that dramatically improve electrical conductivity in material produced according to the present invention.

In the preferred embodiment, annealing is accomplished with a tungsten-halogen source 52 such as a Heatpulse 210 Rapid Thermal Annealing system, available from AG Associates. Annealing using such system is described in *Journal of Applied Physics*, 65, 2069 (1989), R. Kakkad, et al. Exposure is preferably at 700° C. for four minutes, although other temperature ranges and exposure times could be used.

It will be appreciated that annealing, according to the present invention, occurs at relatively low temperature for a relatively short time, and may be accomplished with relatively simple and inexpensive equipment. Low temperature annealing is especially important where, for example, these thin film contact layers are fabricated with an inexpensive glass substrate. It will also be appreciated that a low temperature annealing process according to the present invention can greatly improve conductivity of a preexisting thin film of essentially nuclei free amorphous material, even if such film is prepared other than described herein.

While low temperature rapid thermal annealing is used in the preferred embodiment, the amorphous film could be crystallized using other processes. For example, low temperature conventional furnace annealing could be used instead with a temperature of about 600° C. and an annealing duration of about ten to twenty hours. However the low temperature, short time duration annealing procedure above described is preferable for most semiconductor fabrication, especially when employing substrate materials that may distort and/or flow under thermal exposure.

Figure 5A:
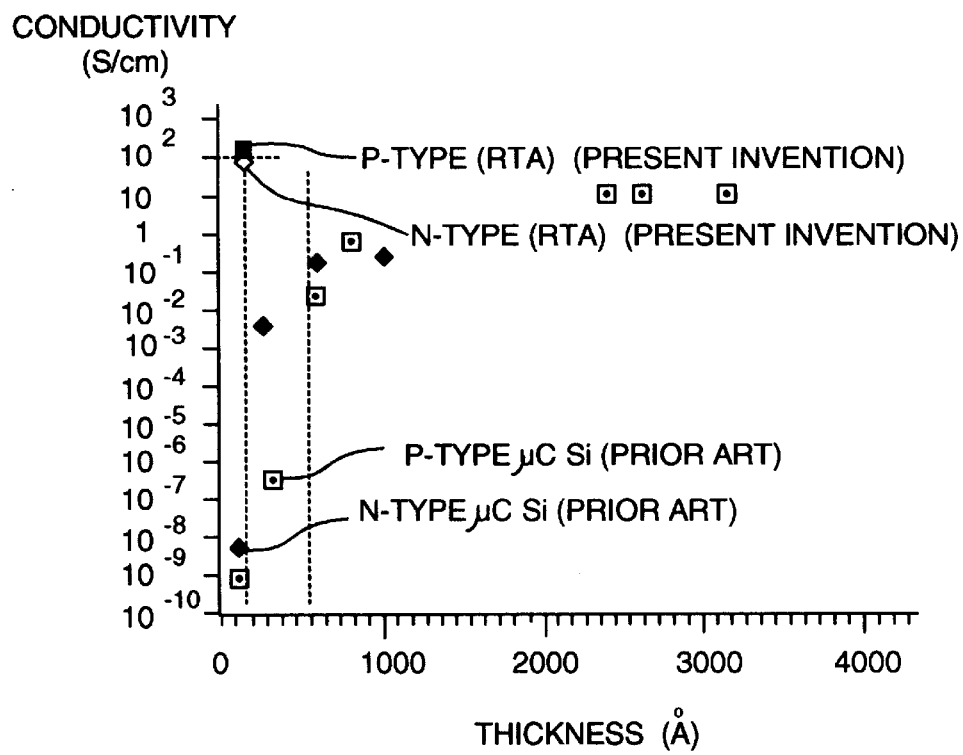
FIG. 5A depicts measured data for thin film produced according to the present invention, and for prior art film.

FIG. 5A compares measured conductivity data for n-type and p-type material produced according to the present invention (denoted "(RTA)") and according to the prior art (denoted "$\mu$C Si"). With reference to the prior art material, it is observed that for film thickness greater than about 500 Å, conductivity is in the range $10^{-2}$ to 10 S/cm, but that conductivity rapidly degrades for thickness below about 500 Å. For example at 200 Å, prior art material exhibits extremely poor conductivity of about $10^{-8}$ to $10^{-9}$ S/cm. By contrast, FIG. 5A reflects that at 200 Å, material produced according to the present invention exhibits excellent conductivity of about 96 S/cm (n-type) to about 145 S/cm (p-type), an improvement of approximately $10^{10}$ compared to 200 Å material produced according to the prior art.

Figure 5B:
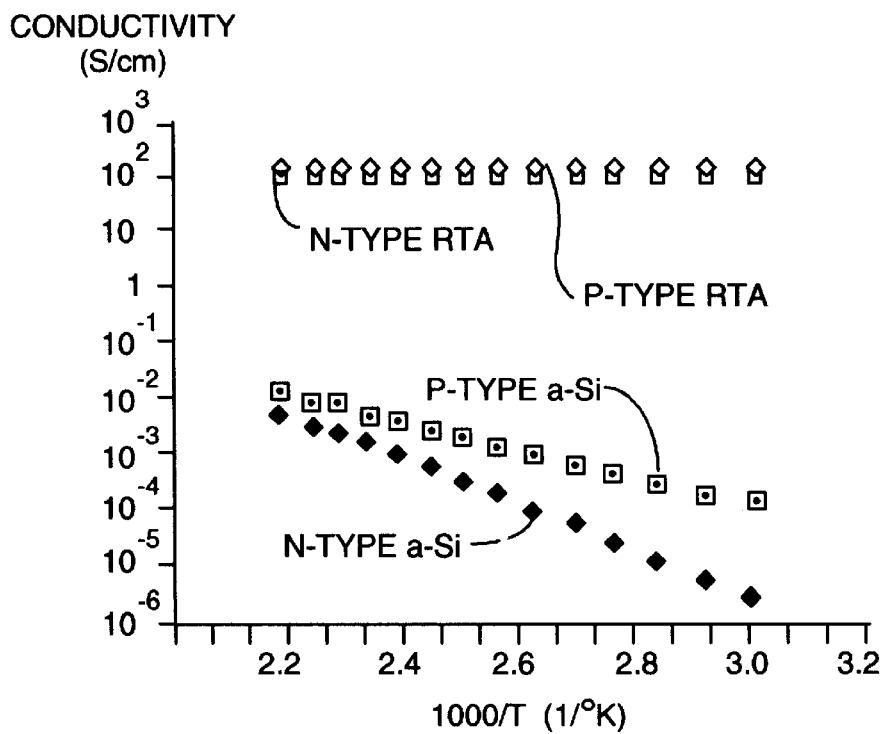
FIG. 5B depicts conductivity as a function of temperature for 200 Å films deposited on a glass substrate in amorphous form before and after rapid thermal annealing at 700° C. for four minutes, according to the present invention.

FIG. 5B depicts conductivity as a function of temperature for 200 Å thick material made according to the present invention, both before and after the annealing stage. FIG. 5B demonstrates that, for the temperature range shown, annealed material produced according to the present invention exhibits conductivity improvement ranging from $10^4$ to $10^8$ compared to the very same material before annealing. The activation energies for the amorphous films before annealing and crystallization using tungsten-halogen are 0.461 eV for p-type and 0.8 eV for n-type films. After annealing according to the present invention, the activation energy value is close to zero for both types of film, indicating that dopant activation as well as crystallization indeed occur due to the described annealing process.

Although the present invention has been described with respect to thin film contact layers used in a detection cell as depicted in FIG. 2, other applications are of course possible.

Figure 6A:
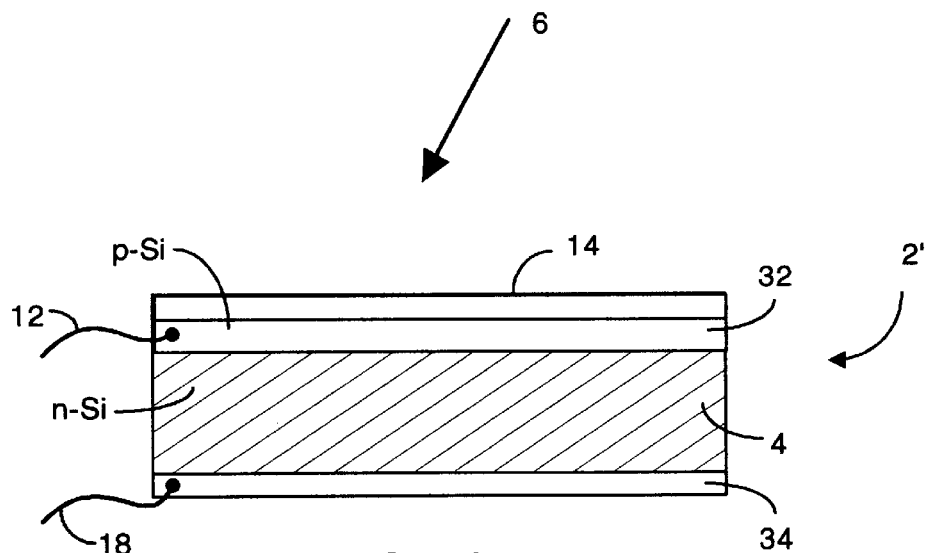
FIGS. 6A–6D depict various semiconductor devices employing thin film material produced according to the present invention.
Figure 6B:
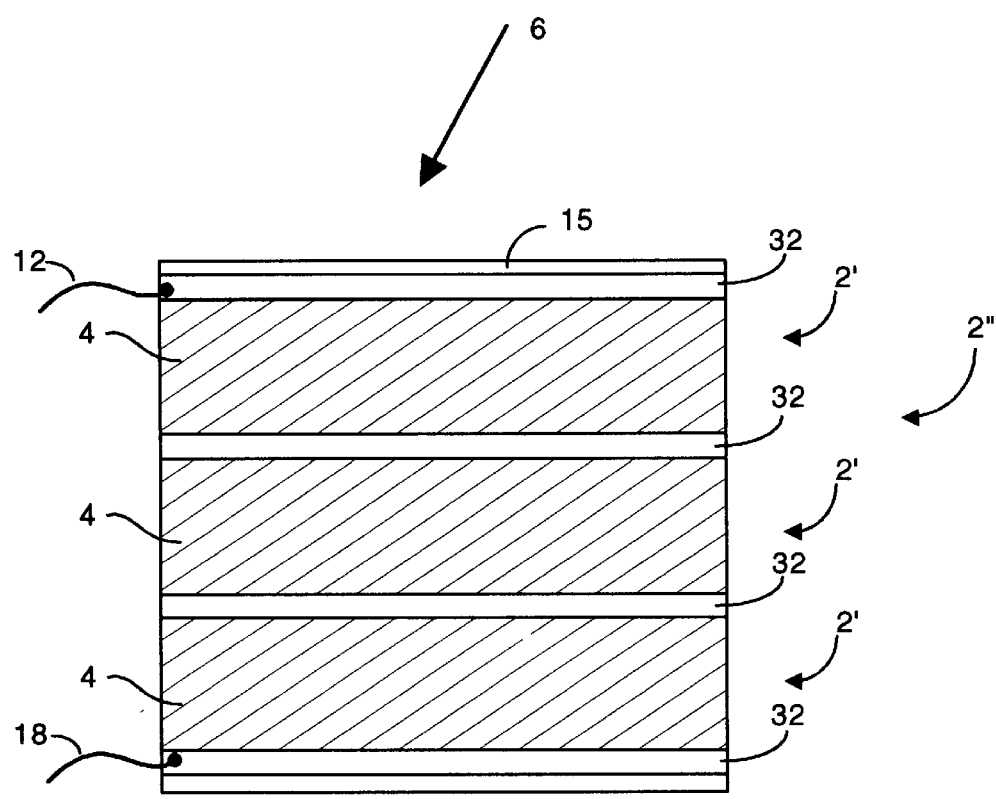

FIG. 6A for example depicts a simple photovoltaic cell 2' with an uppermost Si contact layer 32 that may be p-type or n-type and is made according to the present invention, and an absorption layer 4. Bottom contact layer 34 preferably is made according to the present invention as well. The absorption layer 4 is somewhat analogous to a detector layer and in various embodiments may be amorphous, polycrystalline or crystallized semiconductor material. Typically layer 32 would be about 100 Å to about 200 Å thick. As shown in FIG. 6B, a plurality of such photocells can be fabricated in series to produce a photocell 2" whose voltage output is the sum of the voltage produced by a single cell 2'. Each layer 32 in FIG. 6B is preferably produced according to the present invention.

Figure 6C:
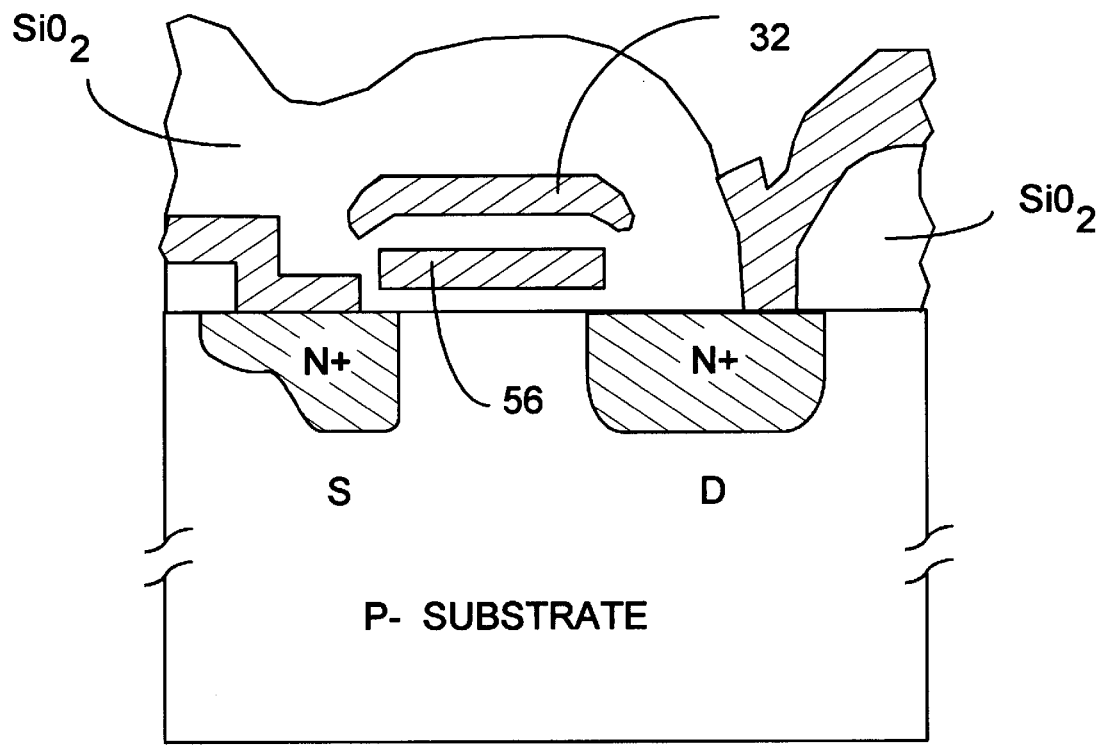
Figure 6D:
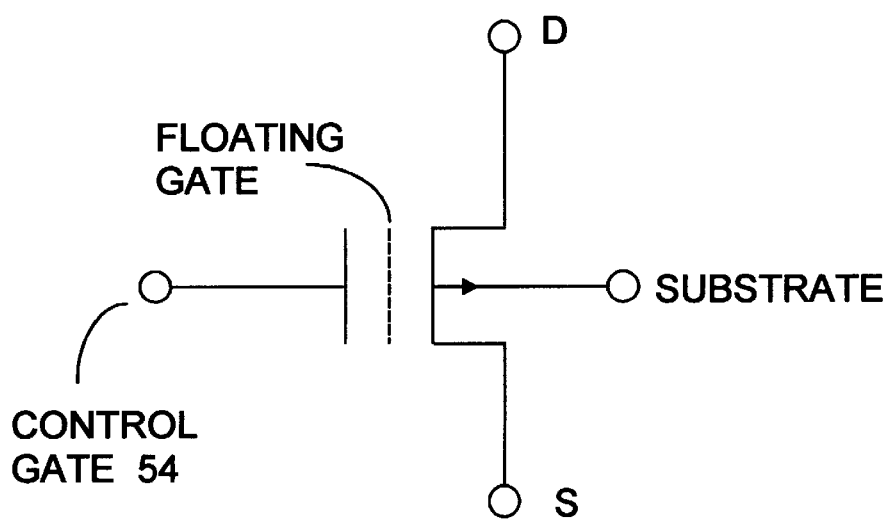

Of course, applicants' process is especially adapted for the production a thin film buried gate in a semiconductor device. The preferred low temperature annealing process minimizes the heat induced lateral migration of atoms on the semiconductor die, and minimizes the migration of atoms through the gate dielectric in memory devices. FIG. 6C and FIG. 6D depict a memory device 52 utilizing a thin film, according to the present invention. In the two layer polysilicon stacked gate EPROM shown in FIGS. 6C and 6D, the control gate 54 and the floating gate 56 are each preferably thin film highly conductive material (e.g., polysilicon) produced according to the present invention. As noted, the deposited amorphous material gates 56, 54 may be annealed at relatively low temperature for a short time (e.g., 700° C. for four minutes) using a rapid temperature annealing process. Thus, during fabrication there is little problem with atom migration on the semiconductor die containing the EPROM structure shown in FIG. 6C and shown schematically in FIG. 6D.

Photovoltaic devices, detector devices, particle detectors and semiconductor devices including buried gate memory devices are well known to those skilled in the semiconductor design and fabrication arts. Thus, while applicants have described in detail the formation of ultra-thin film contact layer material suitable for a few such devices, the design and fabrication of devices employing such films has not been set forth in detail.

Modifications and variations may be made to the disclosed embodiments without departing from the subject and spirit of the invention as defined by the following claims. Thus for example, while thin film highly conductive materials have been described with reference to detection and photovoltaic cells and one type of buried gate memory device, such materials have application in any semiconductor device where high electrical conductivity is required in an ultra-thin film.

What is claimed is:

1. A process for producing a large grain highly conductive thin film material without use of ion implantation, the process comprising the following steps:
   (a) depositing upon a substrate a film of amorphous precursor material that is substantially free of crystal growth-inducing nuclei and sites, said film having a thickness T and a first electrical conductivity S1;
   (b) following step (a), annealing said film to create nuclei and induce growth of large grain crystals having lateral dimensions substantially larger than said thickness T, and to produce a second electrical conductivity S2 that is at least about $10^4$ greater than S1.

2. The process of claim 1, wherein said amorphous precursor material is amorphous silicon.

3. The process of claim 1, wherein step (a) includes simultaneously introducing at least one dopant into said amorphous precursor material being deposited.

4. The process of claim 1, wherein step (a) is carried out using a plasma deposition reactor.

5. The process of claim 1, wherein step (a) is continued until said thickness T ranges from about 100 Å to about 400 Å.

6. The process of claim 1, wherein step (b) is a rapid thermal annealing process.

7. The process of claim 6, wherein said rapid thermal annealing process includes at least one annealing parameter chosen from the group consisting of (i) an annealing temperature of approximately 700° C., and (ii) an annealing duration of approximately four minutes.

8. The process of claim 1, wherein following step (b), said material exhibits an electrical conductivity S2 of about 100 S/cm at a film thickness T of about 200 Å.

9. The process of claim 1, wherein said substrate is a material selected from the group consisting of (i) silicon, (ii) glass, and (iii) quartz.

10. The process of claim 1, wherein step (b) is carried out using a plasma deposition reactor operating with at least one deposition parameter selected from the group consisting of (i) a temperature of about 250° C., (ii) a power density of about 500 mW/cm$^2$, (iii) a pressure of about 1 Torr, (iv) a total flow of about 200 sccm, (v) a ratio of silane gas to dopant gas of about 50:1, and (vi) a dopant concentration in silane gas ranging from about 1% to about 4%.

11. The process of claim 1, wherein step (b) includes a furnace annealing process having at least one annealing parameter chosen from the group consisting of (i) an annealing temperature of approximately 600° C., and (ii) an annealing duration of approximately ten to twenty hours.

12. A process for improving electrical conductivity in a thin film of substantially nuclei free amorphous material deposited upon a substrate, said thin film having a thickness T and a first electrical conductivity S1 (S/cm), the process comprising:
   annealing said thin film without using ion implantation to create nuclei and induce growth of large grain crystals having lateral dimensions substantially larger than said thickness T, and to produce a second electrical conductivity S2 that is at least about $10^4$ greater than S1.

13. The process of claim 12, wherein said annealing is carried out using a process selected from the group consisting of (i) rapid thermal annealing, and (ii) furnace annealing.

14. The process of claim 12, wherein said annealing is a rapid thermal annealing process that includes at least one annealing parameter chosen from the group consisting of (i) an annealing temperature of approximately 700° C., and (ii) an annealing duration of approximately four minutes.

15. The process of claim 12, wherein said thin film is deposited using a plasma deposition reactor operating with at least one deposition parameter selected from the group consisting of (i) a temperature of about 250° C., (ii) a power density of about 500 mW/cm$^2$, (iii) a pressure of about 1 Torr, (iv) a total flow of about 200 sccm, (v) a ratio of silane gas to dopant gas of about 50:1, and (vi) a dopant concentration in silane gas ranging from about 1% to about 4%.

16. The process of claim 12, wherein said annealing is carried out with a furnace annealing process that includes at least one annealing parameter chosen from the group consisting of (i) an annealing temperature of approximately 600° C., and (ii) an annealing duration of approximately ten to twenty hours.

17. The process of claim 12, wherein after said annealing, said material exhibits an electrical conductivity S2 of about 100 S/cm and wherein said film thickness T is about 200 Å.

18. The process of claim 12, wherein said substrate is a material selected from the group consisting of (i) silicon, (ii) glass, and (iii) quartz.

19. The process of claim 12, wherein said thickness T ranges from about 100 Å to about 400 Å.

* * * * *